(12) United States Patent
Consentino et al.

(10) Patent No.: US 9,190,492 B2
(45) Date of Patent: Nov. 17, 2015

(54) SEMICONDUCTOR DEVICE WITH IMPROVED LINEAR AND SWITCHING OPERATING MODES

(71) Applicant: STMicroelectronics S.r.l., Agrate Brianza (IT)

(72) Inventors: Giuseppe Consentino, Gravina di Catania (IT); Antonio Giuseppe Grimaldi, S. Giovanni la Punta (IT); Monica Micciché, Enna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 66 days.

(21) Appl. No.: 13/967,217

(22) Filed: Aug. 14, 2013

(65) Prior Publication Data
US 2014/0054685 A1 Feb. 27, 2014

(30) Foreign Application Priority Data

Aug. 24, 2012 (IT) .............................. TO2012A0742

(51) Int. Cl.

| | |
|---|---|
| H01L 29/66 | (2006.01) |
| H01L 29/423 | (2006.01) |
| H01L 29/78 | (2006.01) |
| H01L 29/10 | (2006.01) |
| H01L 21/336 | (2006.01) |

(52) U.S. Cl.
CPC ...... *H01L 29/66734* (2013.01); *H01L 29/1033* (2013.01); *H01L 29/42376* (2013.01); *H01L 29/7813* (2013.01); *H01L 29/7831* (2013.01)

(58) Field of Classification Search
CPC .................. H01L 29/66734; H01L 29/42376; H01L 29/7831
USPC ............. 257/330, 47, 197, 235, 423; 438/270
See application file for complete search history.

(56) References Cited

U.S. PATENT DOCUMENTS

| 7,202,525 B2 | 4/2007 | Kinzer |
|---|---|---|
| 7,319,256 B1 | 1/2008 | Kraft et al. |

(Continued)

FOREIGN PATENT DOCUMENTS

| JP | 02312281 A | 12/1990 |
|---|---|---|
| JP | 2005203395 A | 7/2005 |
| WO | 2012106834 A1 | 8/2012 |

OTHER PUBLICATIONS

Rutter et al.; Low Voltage Superjunction Power MOSFET: An Application Optimized Technology; 26th Annual IEEE Applied Power Electronics Conference and Exposition (APEC); Mar. 6-11, 2011; Fort Worth, Texas; pp. 491-497.

*Primary Examiner* — Long K Tran
(74) *Attorney, Agent, or Firm* — Seed IP Law Group PLLC (57) ABSTRACT

A semiconductor device that includes a semiconductor body, having a front side and a back side opposite to one another in a first direction of extension; a drift region, which extends in the semiconductor body, faces the front side, and has a first type of conductivity and a first value of doping; a body region, which has a second type of conductivity opposite to the first type of conductivity, extends in the drift region, and faces the front side of the semiconductor body; a first control terminal, which extends on the front side of the semiconductor body, at least partially overlapping, in the first direction of extension, the body region; and a second control terminal, which extends to a first depth in the semiconductor body, inside the body region, and is staggered with respect to the first control terminal.

18 Claims, 11 Drawing Sheets

(56) References Cited

U.S. PATENT DOCUMENTS

2004/0245597 A1* 12/2004 Tihanyi .................. 257/500
2009/0114980 A1    5/2009 Pang
2012/0007139 A1*  1/2012 Tanaka .................. 257/139
2012/0276703 A1* 11/2012 Grivna .................. 438/270
2014/0291765 A1* 10/2014 Ouyang et al. ........ 257/355

* cited by examiner

SEMICONDUCTOR DEVICE WITH IMPROVED LINEAR AND SWITCHING OPERATING MODES

BACKGROUND

1. Technical Field

The present disclosure relates to a semiconductor device with improved linear and switching operating modes, to a method for manufacturing the semiconductor device, and to a method for driving the semiconductor device. In particular, the semiconductor device is a power MOSFET provided with a gate region of a planar type and a gate region of a trench type, which can be biased simultaneously by a single biasing terminal to combine the thermal stability of planar technology in the linear area with the switching operating characteristics of trench technology.

2. Description of the Related Art

Power MOSFETs are electronic devices widely used in various electronic systems. Power MOSFET devices with trench-gate terminal, or of a planar type, are available on the market. In power MOSFETs, the control signal is applied to a gate electrode, which is separated from the semiconductor surface by an insulating layer, typically silicon dioxide $SiO_2$. The control signal is basically a biasing voltage. As compared to a bipolar transistor, the power MOSFET is a unipolar device, i.e., conduction of current occurs by transport of majority carriers in the drift region in the absence of injection of minority carriers for operation of a bipolar transistor. As a consequence of this, no significant delay is observable on account of accumulation or recombination of minority carriers during the turn-off phase. The switching speed is hence higher than that of bipolar transistors. This characteristic is particularly useful in circuits operating at high frequency, where the losses due to switching are particularly high.

Figure 1A:
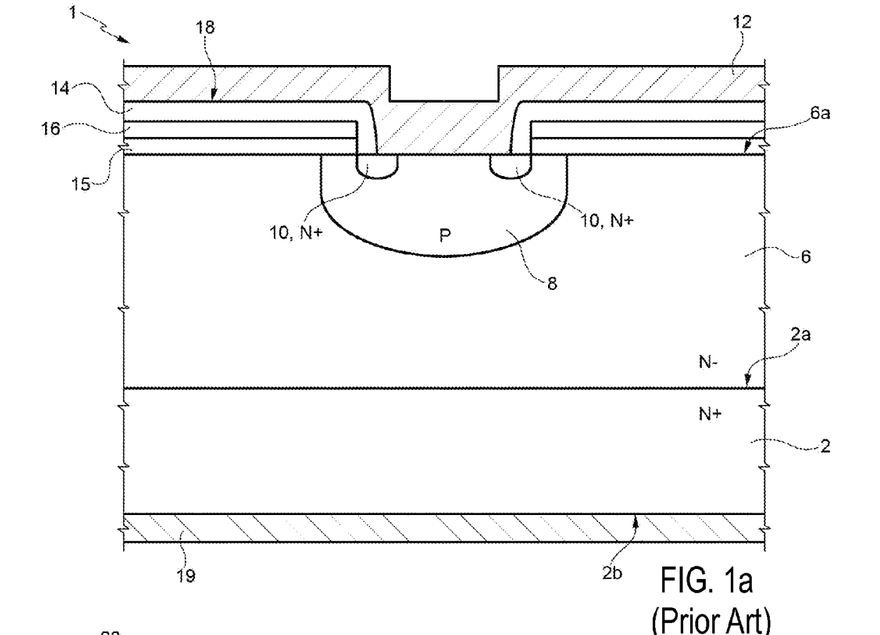
FIGS. 1a, 1b, 2a and 2b show, in cross-sectional view, MOSFETs of a known type.

FIG. 1a shows, in cross-sectional view, a transistor 1, in particular a planar power MOSFET, comprising a silicon substrate 2 with a doping of an N+ type having a front side 2a and a back side 2b.

Formed above the front side 2a of the substrate 2 is a drift layer 6, made of silicon with a doping of an N– type. The drift layer 6 houses, at a top face 6a of its own, a body region 8, which extends in depth in the drift layer 6 starting from the top face 6a and is obtained by implantation of dopant species of a P type. Formed within the body region 8 is a source region 10 by implantation of dopant species of an N type so as to form a region with a doping of an N+ type, which extends in the body region 8 starting from the top face 6a. The transistor 1 further comprises a metal layer 12 formed on the top face 6a of the drift layer 6, in direct contact with the body region 8 and, partially, with the source region 10. The metal layer 12 is moreover separated from portions of the top face 6a external, in top plan view, to the body region 8 by layers set on top of one another of insulating material 14 and polysilicon 16, which extend in such a way that the polysilicon 16 is electrically insulated both from the top face 6a and from the metal layer 12 by the layers of insulating material 14. A gate region 18 of the transistor 1 is thus formed. Finally, formed on the back side 2b of the substrate 2 is a drain terminal 19, made of metal material in direct electrical contact with the substrate 2.

Figure 1B:
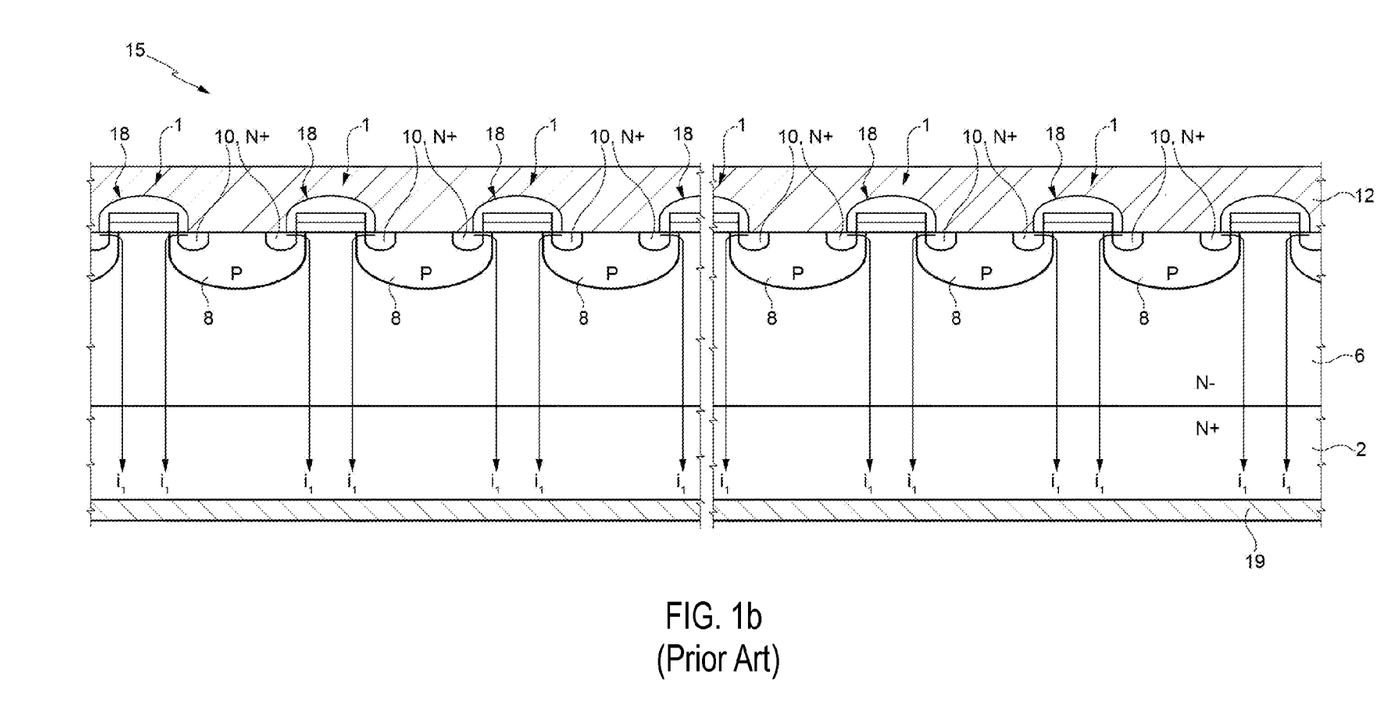

FIG. 1b shows a chip or die 15 comprising a plurality of transistors 1. The chip 15 of FIG. 1b hence comprises a plurality of gate regions 18. Extending between two gate regions 18 set alongside one another is a respective body region 8, which in turn houses a source region 10. The drain terminal 19 is a terminal common to all the transistors 1.

In use, by appropriately biasing the gate terminals 18, the source regions 10, and the drain terminal 19, a current $i_1$ flows between the source regions 10 and the drain terminal 19.

Figure 2A:
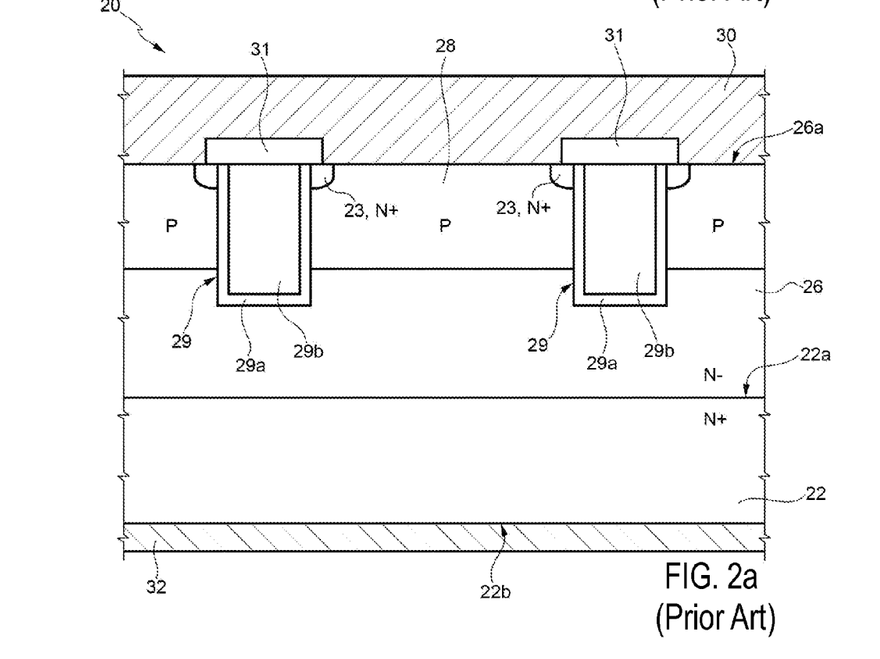

FIG. 2a shows a transistor 20 with trench-gate terminal, according to one embodiment of the present disclosure. The transistor 20 comprises a substrate 22, made of doped semiconductor material, for example silicon with a doping of an N+ type. The substrate 22 has a front side 22a and a back side 22b. Extending on the front side 22a of the substrate 22 is a structural layer 26 of doped semiconductor material, for example silicon with a doping of an N– type. The structural layer 26 is, for example, grown epitaxially on the substrate 22 and has the function of drift layer.

The structural layer 26 houses a body region 28, with a doping of a P type, which extends in depth in the structural layer 26 starting from the top face 26a.

Moreover present are source regions 23, with a doping of an N+ type, which extend in the structural layer 26 within the body region 28 and face the top face 26a of the structural layer 26.

The transistor 20 further comprises gate regions 29 formed in respective trenches, which extend in the structural layer 26, starting from the top face 26a towards the substrate 22. Each trench housing a gate region 29 has a depth greater than the thickness of the body region 28 and smaller than the thickness of the structural layer 26.

Each gate region 29 comprises an insulating portion 29a and a conductive portion 29b, arranged with respect to one another in such a way that the conductive portion 29b is insulated from the structural layer 26 by the insulating portion 29a.

The transistor 20 further comprises a contact-terminal layer 30, made of conductive material, for example metal, which extends above the top face 26a of the structural layer 26, in direct contact with the body region 28 and, at least partially, with the source regions 23. The contact-terminal layer 30 has, in use, the function of source contact of the transistor 20.

The contact-terminal layer 30 is moreover separated from the portions of the gate regions 29 that face the top side 26a of the structural layer 26 by respective insulating regions 31, for example made of borophosphosilicate glass (BPSG), each formed on top of a respective gate region 29.

Finally, extending on the back side 22b of the substrate 22, in direct electrical contact with the substrate 22, is a collector-terminal layer 32 made of conductive material, for example metal.

Figure 2B:
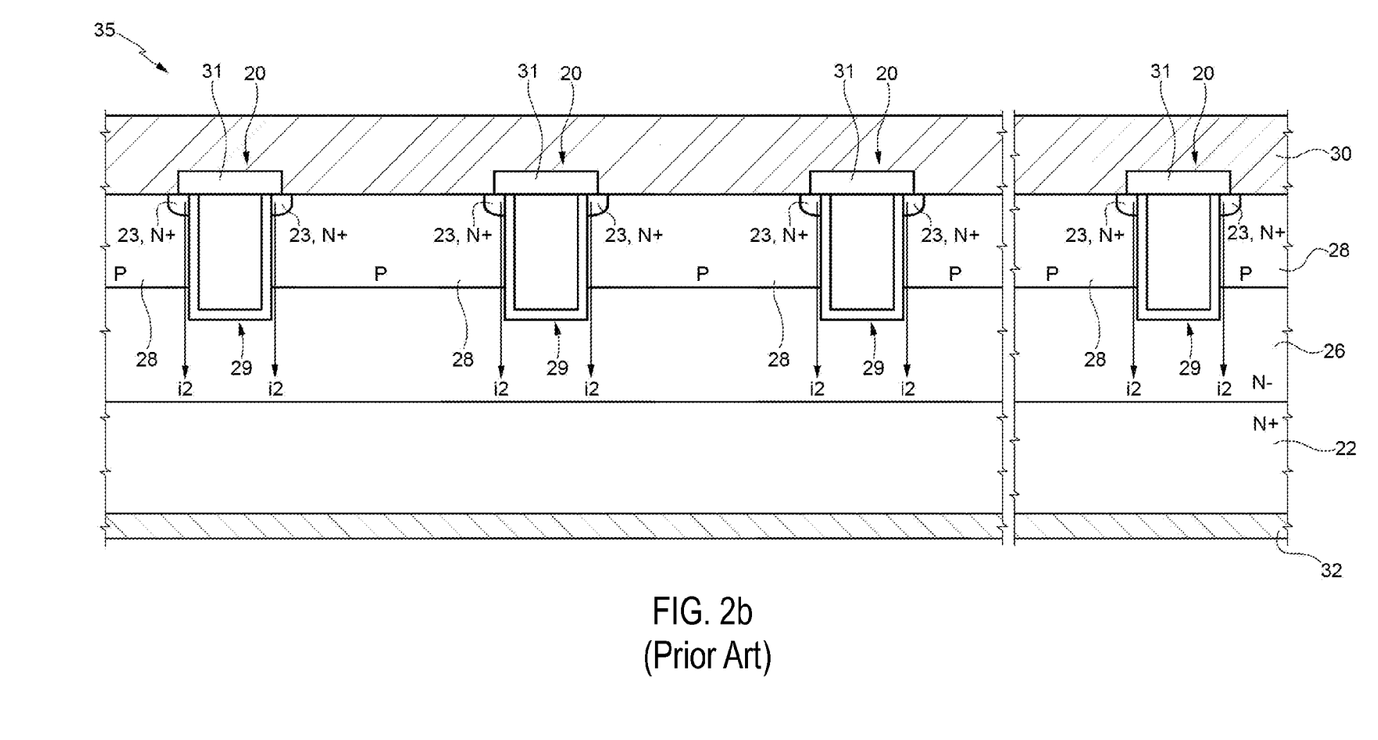

FIG. 2b shows a chip or die 35 comprising a plurality of transistors 20. The chip 35 comprises a plurality of gate regions 26, and a respective plurality of source regions 23.

When a plurality of transistors 20 is integrated in a single chip 35, usually an edge-termination region is formed, here not shown. The body regions 28 extend with continuity between the gate regions 29 so that each body region 28 borders laterally (in cross-sectional view) on two gate regions 29.

The drain terminal 32 is a terminal common to all the transistors 20. In use, by appropriately biasing the gate terminals 29, the source regions 23, and the drain terminal 32, a current $i_2$ flows between the source regions 23 and the drain terminal 32.

Some applications of power MOSFETs envisage the use of the latter in the so-called linear operating zone. This condition is satisfied when high currents and high voltages are applied simultaneously to the transistor. Also during use in switching mode, power MOSFETs work in the linear zone, in particular during the passage through the Miller region. It is known in the literature that, when a power MOSFET operates in these conditions, it could present an unstable electrothermal behavior (process known as "thermal runaway"), which could lead the transistor into conditions of improper operation, or even to its breakdown. One of the electrical parameters used for assessing the thermal instability of a power MOSFET operating in the linear zone is the temperature coefficient (TC). The temperature coefficient TC is defined as the derivative with respect to the temperature of the drain current $I_{drain}$ (TC=$dI_{drain}/dT$). The value of TC may be negative, zero, or positive. When TC>0, by applying a power pulse, the temperature T increases (the transistor heats up), and also the drain current $I_{drain}$ increases. A process of thermal runaway is triggered, which brings the transistor to breakdown. Instead, when TC≤0, as the temperature T increases, there is noted a reduction of the drain current $I_{drain}$, and the transistor operates in stable conditions. With the progressive reduction in dimensions, latest-generation power MOSFETs (for example, of the type illustrated in FIGS. 1a, 1b and 2a, 2b) handle high powers in small volumes, and are for this reason particularly subject to phenomena of thermal instability.

BRIEF SUMMARY

The present disclosure is directed to a semiconductor device with improved linear and switching operating modes, a method for manufacturing the semiconductor device, and a method for driving the semiconductor device that will be able to overcome the drawbacks of the known art.

One embodiment is directed to a semiconductor device that includes a semiconductor body, having a front side and a back side opposite to one another along a first direction of extension, a drift region that extends in the semiconductor body facing the front side, and has a first type of conductivity and a first doping value, a body region, having a second type of conductivity opposite to the first type of conductivity that extends in the drift region and faces the front side of the semiconductor body, a first control terminal that extends on the front side of the semiconductor body, at least partially overlapping, along the first direction of extension, the body region, and a second control terminal which extends to a first depth in the semiconductor body, within the body region, and is staggered with respect to the first control terminal along the first direction of extension.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 3:
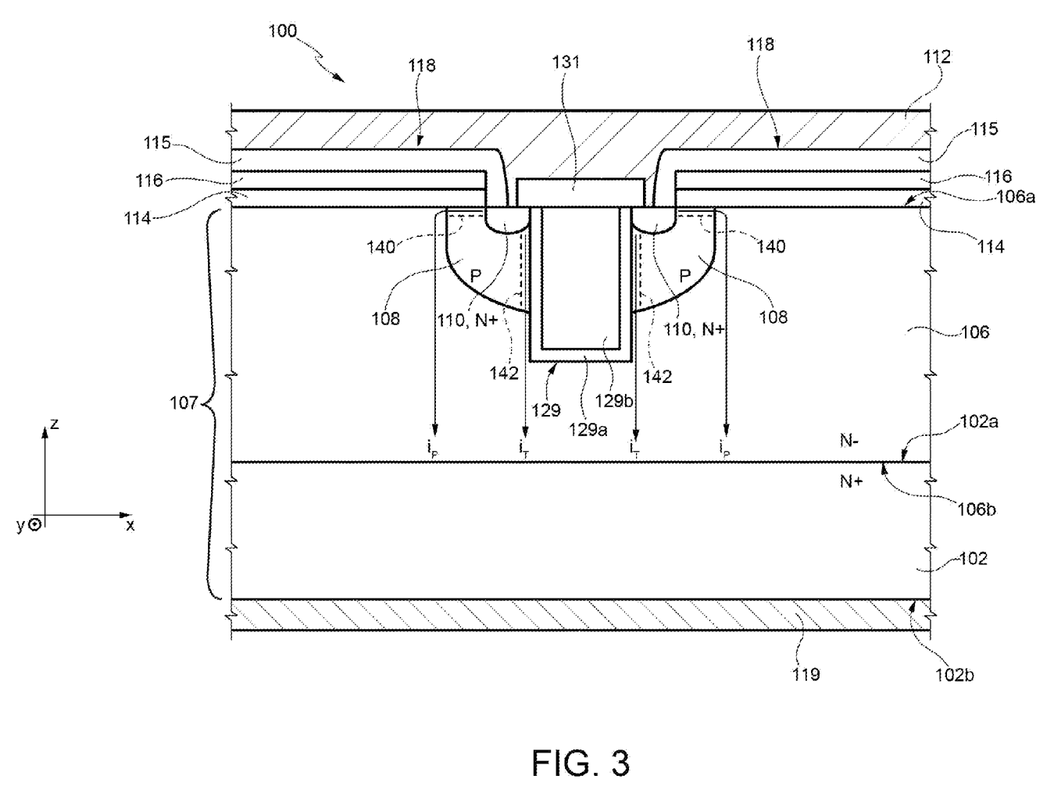
FIG. 3 shows, in cross-sectional view, a semiconductor device according to an embodiment of the present disclosure.

FIG. 3 shows, in cross-sectional view, a semiconductor device 100, in particular a transistor, even more in particular a power MOSFET according to one embodiment of the present disclosure. The transistor 100 of FIG. 3 comprises a substrate 102 of semiconductor material, for example silicon with a doping of an N+ type, having a front side 102a and a back side 102b, opposite to one another in the direction of the axis Z.

Extending on the front side 102a of the substrate 102 is a structural layer 106, made of semiconductor material, for example silicon with a doping of an N− type. The structural layer 106 is formed, for example, by epitaxial growth of semiconductor material, in a way in itself known. However, the structural layer 106 can be formed in a way different from epitaxial growth, for example by depositing semiconductor material. The structural layer 106 has, in use, the function of drift layer in which the conduction of electric current takes place. The structural layer 106 has a front side 106a and a back side 106b. The back side 106b of the structural layer 106 directly faces the front side 102a of the substrate 102. The substrate 102 and the structural layer 106 form, together, a semiconductor body 107. The front side 106a of the structural layer 106 forms a front side of the semiconductor body 107; the back side 102b of the substrate 102 forms a back side of the semiconductor body 107.

The structural layer 106 houses a body region 108, which extends in depth in the structural layer 106 starting from, and directly facing, the front side 106a. The body region 108 has a type of conductivity opposite to the type of conductivity of the structural layer 106, and in particular is of a P type. Formed within the body region 108 is at least one source region 110. In particular, FIG. 3 shows two source regions 110 that have a conductivity of an N type. The source regions 110 have a doping of an N+ type and extend in the body region 108 starting from the front side 106a of the structural layer 106, at a distance (along the axis X) from one another. According to one embodiment, the source regions 110 have, in top plan view (in the plane XY), a substantially rectangular shape (strip shape)—see, for example, FIG. 4.

Extending on top of the front side 106a of the structural layer 106, alongside the source regions 110, are stacked layers of dielectric material 114 (for example, insulating material, such as $SiO_2$) and polysilicon 116. The dielectric layer 114 extends in direct contact with the structural layer 106; the polysilicon layer 116 extends on top of the dielectric layer 114 in such a way as to be electrically insulated from the front side 106a by the dielectric layer 114 (for example, made of silicon dioxide). A further dielectric layer 115 extends on the polysilicon layer 116 in such a way as to insulate the latter at the top. The polysilicon layer 116 can be replaced by a conductive layer of some other material, for example metal.

The stack of the dielectric layer 114, the polysilicon layer 116, and the dielectric layer 115 forms a first gate region 118 of the transistor 100. The embodiment of FIG. 3 shows the transistor 100 comprising two gate regions 118. According to a further embodiment, the transistor 100 comprises a single gate region 118.

The transistor 100 further comprises at least one second gate region 129, which extends in depth in the structural layer 106. In particular, the second gate region 129 has a main extension along the axis Z and extends from the front side 106a (which it directly faces) towards the substrate 102. According to one embodiment, the second gate region 129 extends in the structural layer 106 for a depth (measured along the axis Z), greater than the extension (once again along Z) of the body region 108, and in any case smaller than the total thickness of the structural layer 106. According to a different embodiment, the second gate region 129 extends in the structural layer 106 for a depth (measured along the axis Z), equal to the extension (once again along Z) of the body region 108.

The second gate region 129 comprises an insulating portion 129a (made, for example, of silicon dioxide $SiO_2$) and a conductive portion 129b (made, for example, of N-doped polysilicon, or metal material), arranged with respect to one another in such a way that the conductive portion 129b is insulated from the structural layer 106 by the insulating portion 129a.

The second gate region 129 is formed, according to one embodiment, by the steps of: digging a trench (not shown) in the structural layer 106, at the front side 106a; forming (for example, by deposition of $SiO_2$, or thermal growth of $SiO_2$), in an area corresponding to an inner wall of the trench, the insulating portion 129a; forming (for example, by deposition of N-doped polysilicon), in the trench and inside the insulating portion, the conductive portion 129b, in such a way that the conductive portion 129b is electrically insulated from the structural layer 106.

Figure 4:
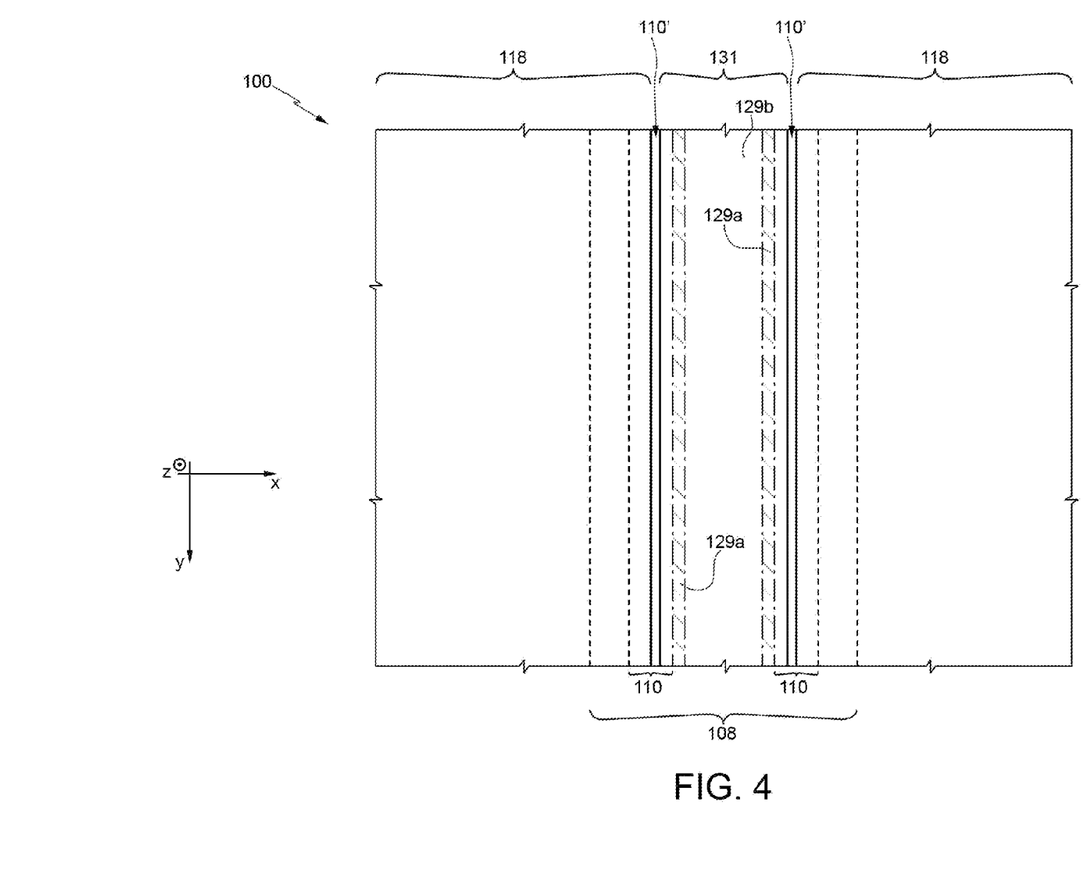
FIG. 4 shows, in top plan view, the semiconductor device of FIG. 3.

The second gate region 129 extends between the two source regions 110, and, in particular, borders on them directly along the axis X (see the top plan view of FIG. 4). As has been said, the conductive portion 129b is electrically insulated from the source regions 110 by the insulating portion 129a. Moreover, an insulating region 131, for example made of borophosphosilicate glass (BPSG), formed in a way in itself known, extends on top of the front side 106a of the structural layer 106, in an area corresponding to the second gate region 129 (in particular aligned, along Z, to the conductive portion 129b). The insulating region 131 has the function of electrically insulating the conductive portion 129b of the second gate region 129 at the top. The insulating region 131 extends on top of the structural layer 106 between two first gate regions 118, but is not in direct contact therewith. In this way, as may be noted in the top plan view in FIG. 4, between the insulating region 131 and respective dielectric layers 115 of the first gate regions 118, a surface portion 110' of the source regions 110 is exposed.

The transistor 100 of FIG. 3 further comprises a metal layer 112, which is formed on the front side 106a of the structural layer 106, and extends between the insulating region 131 and the respective dielectric layers 115 of the first gate regions 118, until it reaches and comes into electrical contact with surface portions 110' of the source regions 110. The metal layer 112 is configured to form a source contact terminal of the transistor 100. Formed on the back side 102b of the substrate 102, is a metal layer 119, in direct electrical contact with the substrate 102. The metal layer 119 is configured to form a drain terminal of the transistor 100.

The transistor 100 is hence provided with a double gate, i.e., the first gate region 118 (planar gate) and the second gate region 129 (trench gate).

In use, both of the gate regions 118, 129 are biased simultaneously via a common biasing terminal (not shown), so as to drive the transistor 100 as planar transistor (like the transistor of FIG. 1a) and as trench transistor (like the transistor of FIG. 2a), when the respective conduction thresholds are reached. By biasing the first gate regions 118, respective conductive channels 140 are formed in the body region 108 close to the front side 106a of the structural layer 106, so that a flow of current $i_P$ can flow between the source regions 110 and the drain terminal 119, through the conductive channels 140. By biasing the second gate region 129, conductive channels 142 are formed in the body region 108 close to the second gate region 129, so that a further flow of current $i_T$ can flow between the source regions 110 and the drain terminal 119, through the conductive channels 142.

The transistor 100 of FIG. 3 enables flows of current $i_P$ and $i_T$ to be obtained that can be handled through two different gate regions (gates 118 and 129) and that flow through two different channels (channels 140 and 142). The structure of the transistor 100 of FIG. 3 enables two different values of threshold voltage $V_{TH\_P}$ and $V_{TH\_T}$ (with $V_{TH\_P} < V_{TH\_T}$) to be obtained in one and the same transistor. The first threshold value $V_{TH\_P}$, which is lower, is associated to the formation of the conduction channel 140; the second threshold value $V_{TH\_T}$, which is higher than the first threshold value $V_{TH\_P}$, is associated to the formation of the conduction channel 142. In other words, the value of transconductance gfs associated to the channel 140 is lower than the value of transconductance gfs associated to the channel 142. Consequently, associated to the channel 140 is a value of drain-to-source on-state resistance $R_{DSON\_P}$ higher than the value of drain-to-source on-state resistance $R_{DSON\_T}$ associated to the channel 142.

In use, by biasing simultaneously both the first gate regions 118 and the second gate region 129 with one and the same gate-to-source voltage Vgs (initially Vgs<$V_{TH\_P}$), and then increasing the gate-to-source voltage Vgs, there is noted in the first place formation of the channel 140 (when Vgs=$V_{TH\_P}$) and, next, formation of the channel 142 (when Vgs=$V_{TH\_T}$>$V_{TH\_P}$).

In conclusion, in the linear operating zone, the current $i_P$ between source and drain flows through the channel 140 and is controlled by the gate region/regions 118; for fast-switching operations, instead, both the channel 140 and the channel 142 are used, biasing the first and second gate regions 129 with Vgs≥$_{TH\_T}$.

It is evident that a plurality of transistors 100 can be integrated in a single chip.

Figure 5:
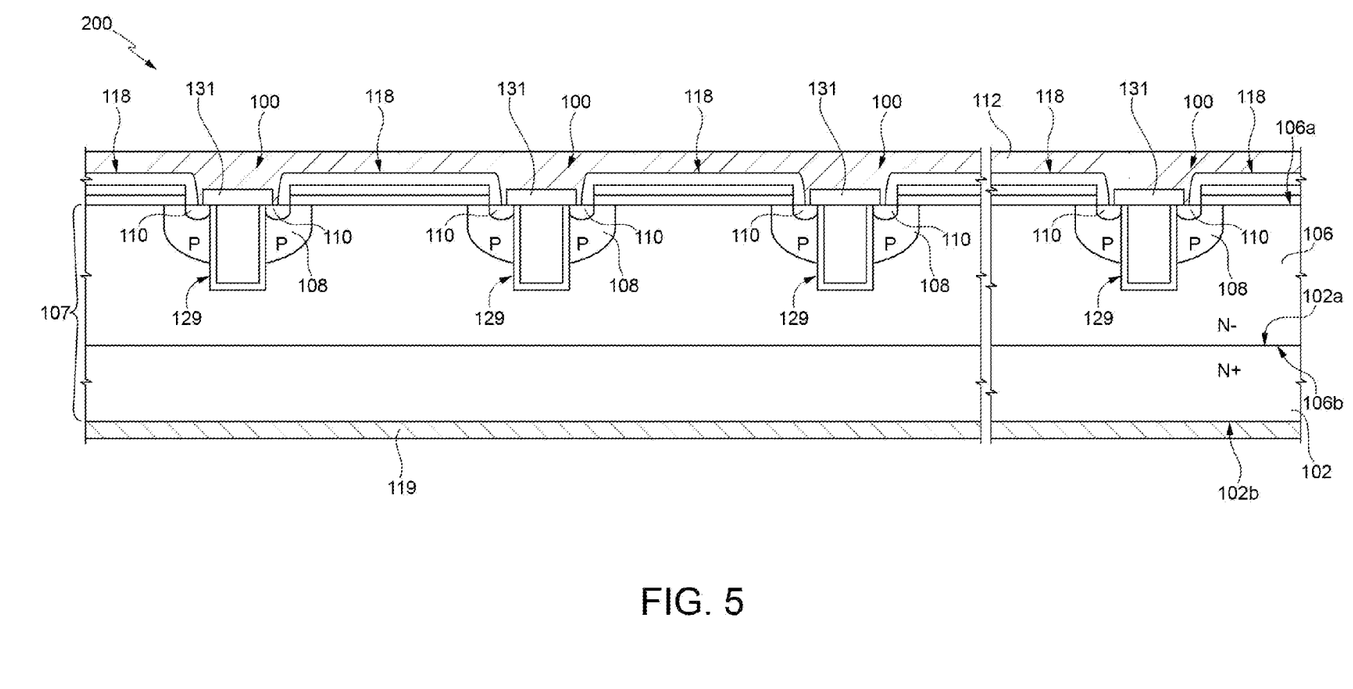
FIG. 5 shows, in cross-sectional view, a chip comprising a plurality of semiconductor devices of the same type as the one shown in FIG. 3.

For example, FIG. 5 shows a chip or die 200 comprising a plurality of transistors 100. The chip 200 of FIG. 5 comprises a plurality of first gate regions 118 and a plurality of second gate regions 129, which extend in the structural layer 106, inside the body region 108 as described previously. Extending between the first gate regions and the second gate regions are respective source regions 110.

According to one embodiment, an edge-termination region, not shown and of a type in itself known, extends in peripheral portions of the chip 200 so as to surround the transistors 100 completely.

Figure 6:
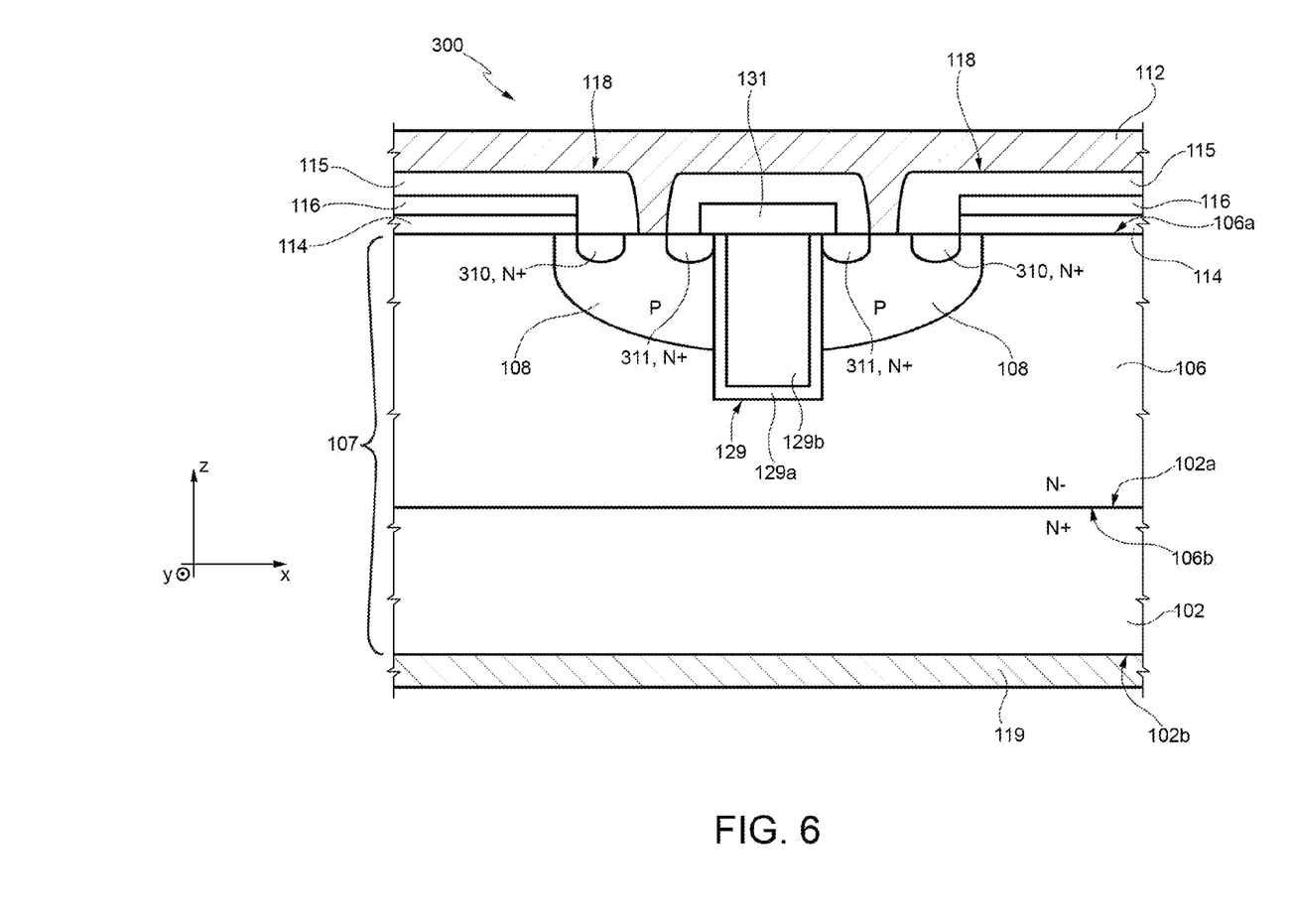
FIG. 6 shows, in cross-sectional view, a semiconductor device according to a further embodiment of the present disclosure.
Figure 7:
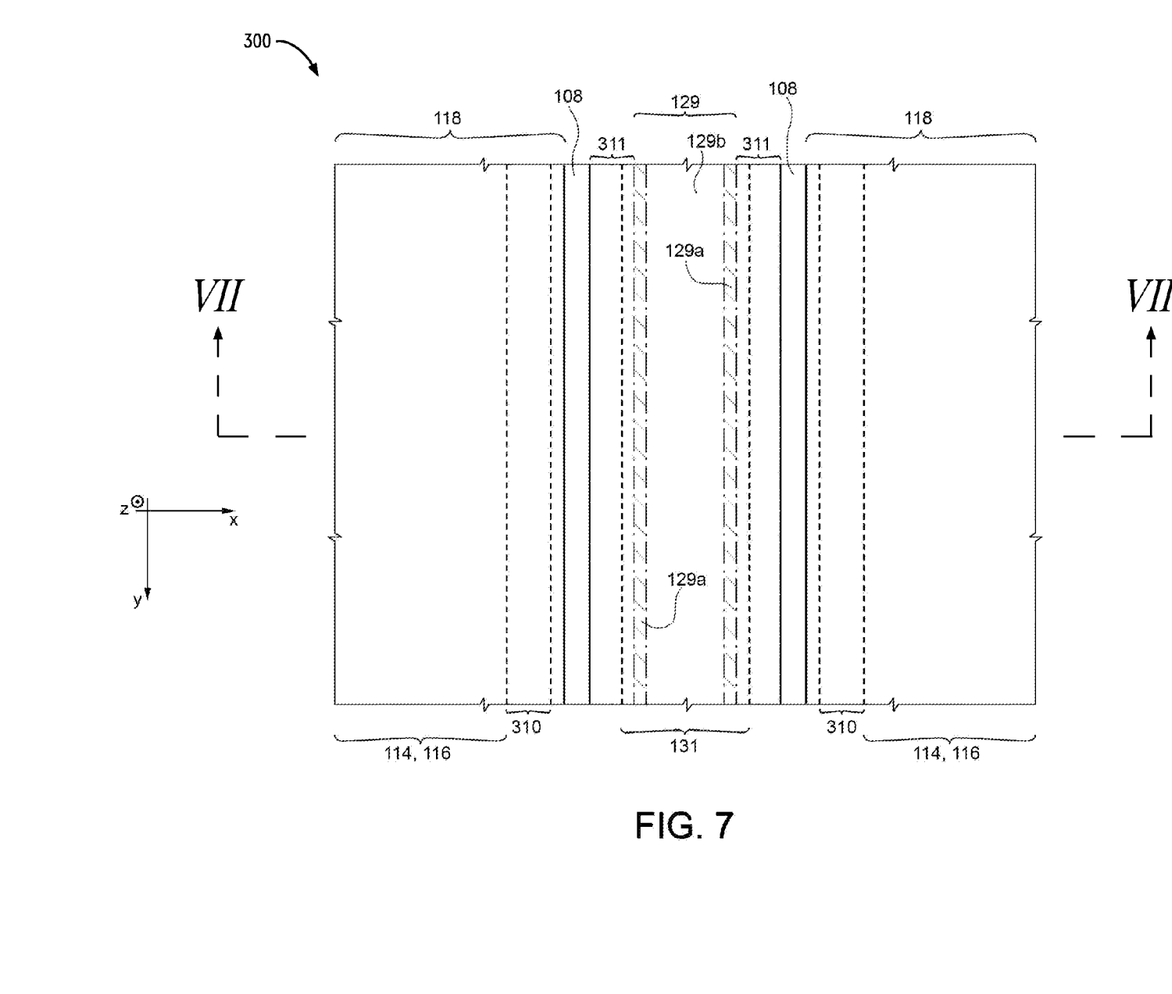
FIG. 7 shows, in top plan view, the semiconductor device of FIG. 6.

FIG. 6 shows, in cross-sectional view taken along the line of cross section VII-VII of FIG. 7, a transistor 300 according to a further embodiment of the present disclosure. FIG. 7 shows the transistor 300 in top plan view. Elements that are common to the transistor 300 of FIG. 6 and to the transistor 100 of FIG. 3 are not described any further, and are designated by the same reference numbers.

The transistor 300 differs from the transistor 100 in that it comprises a source region 310 designed to supply charge carriers to the conductive channel 140, and a further source region 311 designed to supply charge carriers to the conductive channel 142. The source regions 310 and 311, which have a conductivity of an N type (in particular, an N+ type), extend in the body region 108 at one and the same side of the second gate region 129 (when considered in the cross-sectional view of FIG. 6 or in the top plan view of FIG. 7), and starting from the front side 106a of the structural layer 106. The source regions 310 and 311 are separated from one another by a portion of the body region 108.

In other words, the source region 311 extends in the body region 108 between the second gate region 129 and the source region 310. This embodiment presents the advantage that, by using two separate source implantations with different doses and different energies, it is possible to obtain a greater degree of freedom to form two (or more) transistors with thresholds that differ from one another.

In particular, FIG. 6 shows two source regions 310 and two source regions 311. A first pair formed by a source region 310 and a source region 311 extends, as described previously, on a first side of the second gate region 129; a second pair formed by a source region 310 and a source region 311 extends on a second side, opposite to the first side along X, of the second gate region 129. The source regions 310, 311 have a doping of an N+ type and are obtained, for example, by implantation of dopant species. According to one embodiment, the source regions 310, 311 have, in top plan view (in the plane XY), a substantially rectangular shape (strip shape)—see, for example, FIG. 7.

In a way similar to what is shown in FIG. 5 and described with reference to said figure, a plurality of transistors 300 can be integrated in a single chip or die.

Figure 8:
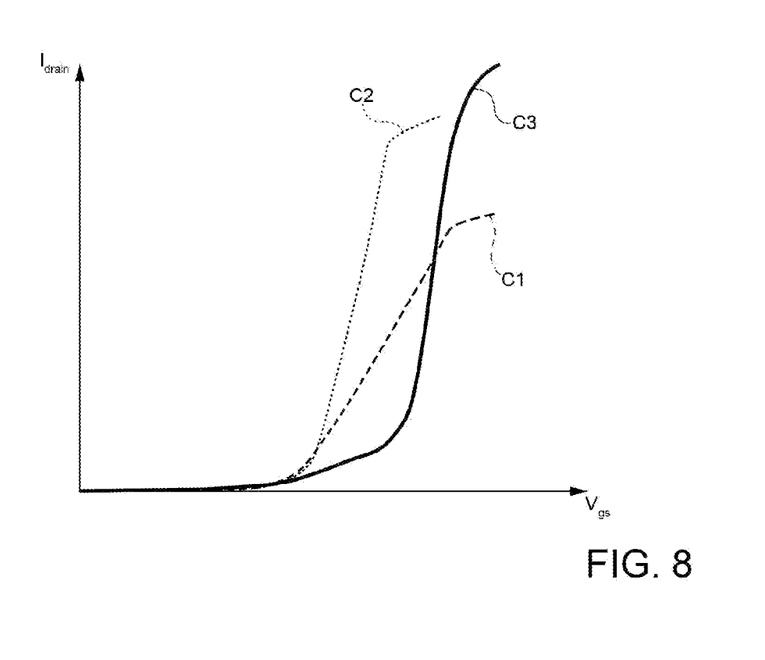
FIG. 8 shows, compared with one another, I-V transcharacteristic curves of the transistors of FIGS. 1 to 3.

FIG. 8 shows curves provided by way of example of I-V (current-voltage) transcharacteristics of the transistor 1 of FIG. 1 (curve C1), of the transistor 20 of FIG. 2 (curve C2), and of the transistor 100 of FIG. 3, or transistor 300 of FIG. 6 (curve C3). As has been said, the curves represented are provided by way of example of the I-V behaviors (where I is the drain current and V the gate-to-source voltage) of the respective transistors in comparable structural and operating conditions. The curves C1-C3 hence show the dependence of the drain current upon the gate-to-source voltage that regulates the conductance of the respective transistor 1, 20, 100 (or 300). Of course, the curves C1-C3 regard a pre-set value of the drain-to-source voltage.

As may be noted, for low values of drain current, the curve C3 shows that the transistor 100 has a behavior similar to the behavior of a planar transistor (i.e., the plot C3 is similar to the plot C1); instead, for high values of the drain current, the transistor 100 (or 300) has a behavior similar to the behavior of a trench transistor (i.e., the plot C3 is similar to the plot C2).

Figure 9:
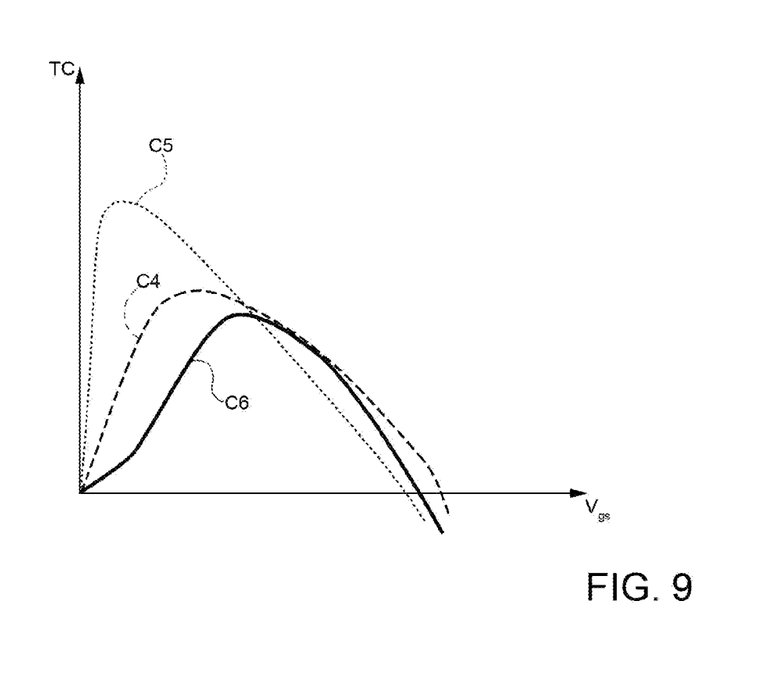
FIG. 9 shows, compared with one another, curves of variation of the temperature coefficient of the transistors of FIGS. 1 to 3.

FIG. 9 shows, by way of example, curves for evaluating the degree of thermal instability of the transistor 1 of FIG. 1 (curve C4), of the transistor 20 of FIG. 2 (curve C5), and of the transistor 100 of FIG. 3, or the transistor 300 of FIG. 6 (curve C6). The curves C5-C6 show the variation of the temperature coefficient TC as the value of gate-to-source voltage increases, for the transistors 1, 20, 100 (or 300).

As may be noted, the curve C6 of the transistor 100 shows that the maximum value of temperature coefficient TC reached by the transistor 100 (or 300) in use is always lower than the maximum value reached by the planar and trench transistors of a known type (curves C4 and C5). The present applicant has verified that, in extreme cases of very high currents, the curve C6 can exceed the curve C4 in terms of maximum value of the temperature coefficient TC. However, it remains always below the maximum value reached by the curve C5.

From an examination of the characteristics of the disclosure provided according to the present disclosure, the advantages that it affords are evident.

In particular, the planar-trench hybrid structure of the device according to the present disclosure makes it possible to combine the best qualities of the two technologies, namely, a better thermal stability of the planar technology in the linear zone and a better performance of the trench technology in switching operation.

Finally, it is clear that modifications and variations may be made to what has been described and illustrated herein without thereby departing from the sphere of protection of the present disclosure.

Figure 10:
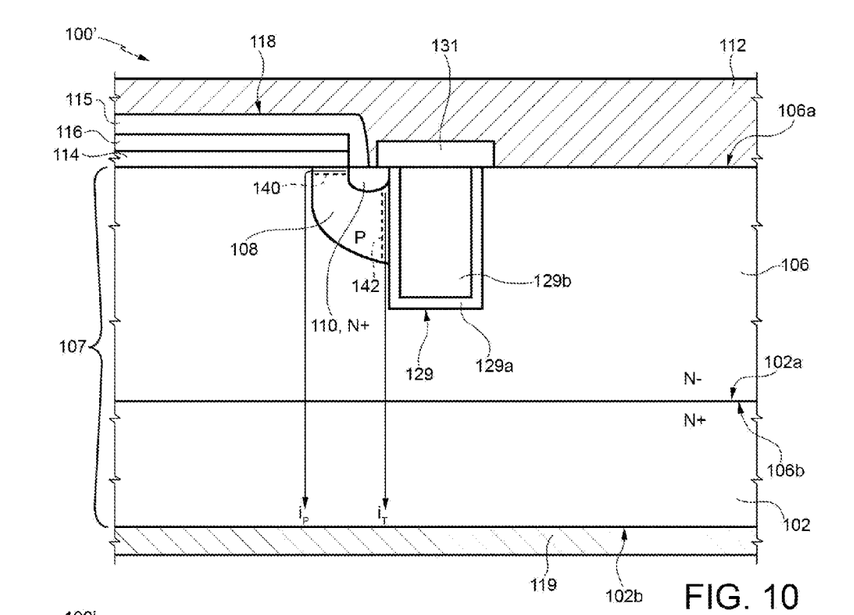
FIG. 10 shows a semiconductor device according to a further embodiment of the present disclosure.

In particular, according to a further embodiment of the present disclosure, shown in FIG. 10, a transistor 100' comprises a single source region 110, a single gate region 118, and a single gate region 129. In greater detail, the transistor 100' comprises (elements common to the transistor 100 are designated by the same reference numbers): the semiconductor body 107, formed by the substrate 102 and by the structural layer 106; the drift region 106 with a doping of an N− type, which extends in the semiconductor body 107; the body region 108, of a P type, which extends in the semiconductor body 107 facing the front side 106a of the structural layer 106, and is (partially or completely) surrounded by the drift region 106; a source region 110 of an N type, which extends in the body region 108 and also faces the front side 106a; the gate region 118, which extends on the front side 106a of the semiconductor body, partially overlapping the first body region 108, and which extends alongside the source region 110, in an area corresponding to a first lateral portion of the source region 110; and the gate region 129, which extends in the semiconductor body 107, facing the front side 106a, within the body region 108, and which extends in an area corresponding to a second lateral portion, opposite to the first lateral portion, of the source region 110.

Figure 11:
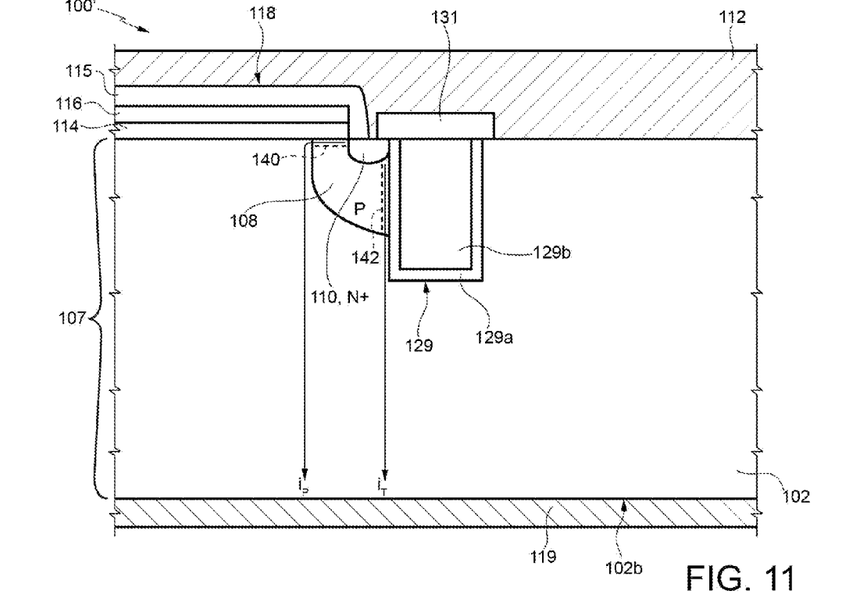
FIG. 11 shows a semiconductor device according to a further embodiment of the present disclosure.

According to a further embodiment of the present disclosure, shown in FIG. 11, the semiconductor body 107 comprises just the substrate 102, with a doping of an N type (and a value of doping chosen appropriately, for example an N− doping), and does not comprise the structural layer 106. The body region 108, the source region 110, and the gate region 129 are formed in the substrate 102 and extend therein in a way similar to what has been described previously with reference to any of the embodiments of the present disclosure.

Moreover, the semiconductor body 107 (including just the substrate 102, or the substrate 102 and the structural layer 106) may be made of a semiconductor material different from silicon, for example silicon carbide, gallium nitride, gallium arsenide, or some other material.

Moreover, it is evident that it is possible to provide a transistor in which the majority carriers are holes. In this case, the types of conductivity N and P are reversed (the semiconductor body 107 has a conductivity of a P type, the body region 108 has a conductivity of an N type, and the source region has a conductivity of a P type).

Figure 12:
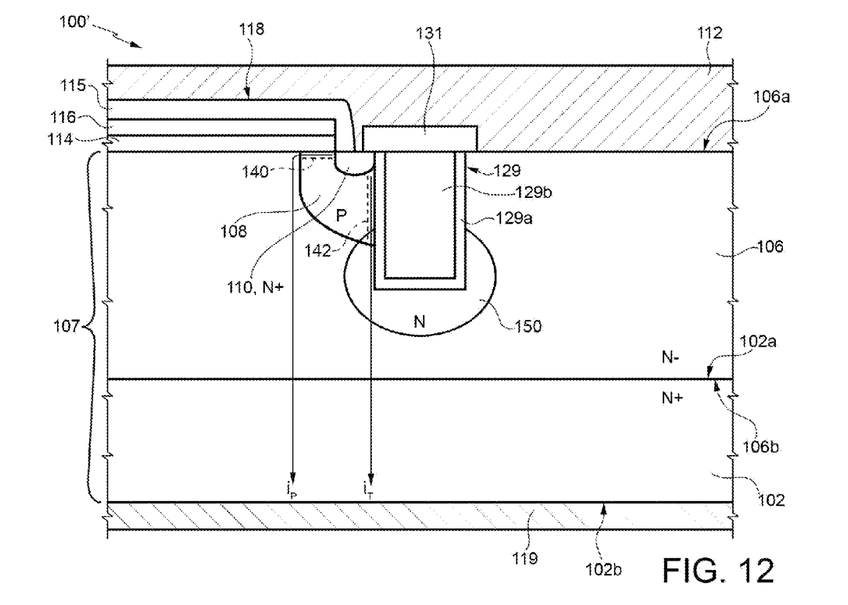
FIGS. 12 and 13 show a respective semiconductor device according to respective further embodiments of the present disclosure.

In addition, as shown in FIG. 12 according to an embodiment provided by way of example, the semiconductor device 100' further comprises an implanted region 150, of an N type, which extends in the semiconductor body 107 in an area corresponding to the terminal portion at a depth greater than the depth at which the second gate region 129 extends, and aligned to the second gate region 129 along Z. Furthermore, said implanted region 150 extends alongside the second gate region 129 (i.e., it has a width, along X, greater than the respective width, along X, of the second gate region 129) in such a way as to intercept the region in which, in use, the conductive channel 142 is formed.

An implanted region of this type is described, for example, in U.S. Pat. No. 7,202,525, and presents the advantage of enabling a reduction of the drain-to-source on-state resistance ($R_{DSON}$). The teaching of FIG. 12 may be applied to any of the embodiments of the present disclosure.

Moreover, the second gate region 129 can be a "trench gate" formed in a way different from what has been described herein, for example of the type described in U.S. Pat. No. 7,319,256.

Figure 13:
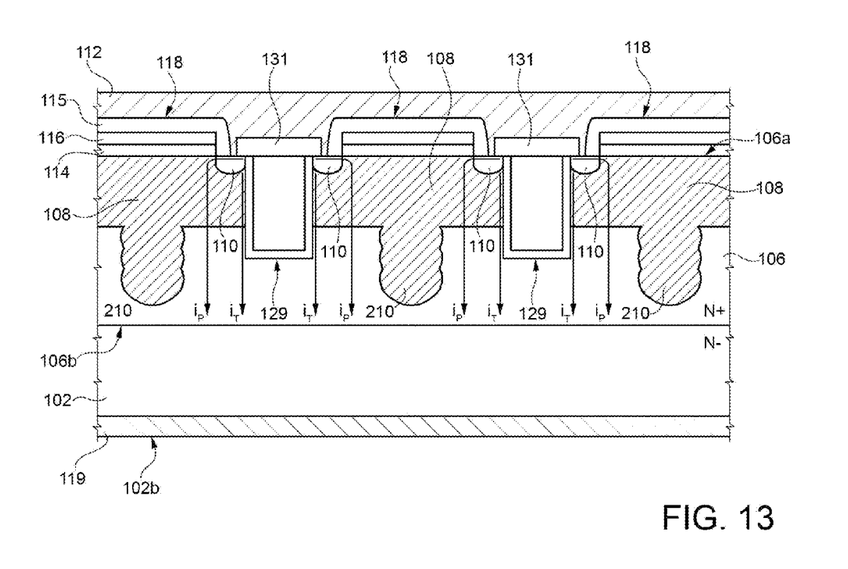

In addition, as shown by way of example in FIG. 13, the semiconductor device according to the present disclosure comprises, in one embodiment, a superjunction (SJ) structure, for example of the type shown and described in "Low Voltage Superjunction Power MOSFET: An Application Optimized Technology", by Phil Rutter, Steven T. Peake, NXP Semiconductors, Manchester, UK, in which the body region 108 comprises one or more pillars 210 of a P type, which extend in depth in the drift region of an N type, between second gate regions 129 set alongside, and aligned, along Z, with a respective first gate region 118. The teaching of FIG. 13 may be applied to any of the embodiments of the present disclosure.

Furthermore, it is evident that, for all the embodiments described according to the present disclosure, the regions of an N type can be replaced with regions of a P type, and vice versa, so as to provide devices that have a predefined type of charge carriers (P or N).

Finally, the teaching according to the present disclosure can apply to different types of devices, such as for example IGBTs or others still.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
   a semiconductor body, having a front side and a back side opposite to one another along a first direction of extension;
   a drift region in the semiconductor body facing the front side, the drift region having a first type of conductivity and a first doping value;
   a body region in the drift region facing the front side of the semiconductor body, the body region having a second type of conductivity opposite to the first type of conductivity;
   a first control terminal on the front side of the semiconductor body, at least partially overlapping, in the first direction of extension, the body region;
   a second control terminal at a first depth in the semiconductor body, within the body region, and staggered with respect to the first control terminal along the first direction of extension; and
   a first channel region that extends in the body region facing the first control terminal, and a second channel region that extends to a second depth in the body region, facing the second control terminal, said second depth being equal to, or greater than, said first depth, wherein:
      the first control terminal is configured to be biased to form, in the first channel region, a first conductive channel having a main direction of conduction in a second direction of extension transverse to the first direction of extension, and
      the second control terminal is configured to be biased to form, in the second channel region, a second conductive channel having a main direction of conduction in the first direction of extension.

2. The semiconductor device according to claim 1 wherein the first and second control terminals are electrically coupled to a common biasing terminal.

3. The semiconductor device according to claim 1, wherein said first channel region has a first threshold voltage associated with formation of the first conductive channel, and the second channel region has a second threshold voltage associated with formation of the second conductive channel, said first threshold voltage being lower than the second threshold voltage.

4. The semiconductor device according to claim 1, further comprising a first source region, having the first type of conductivity that extends in the body region and faces the front side, wherein:
   the first control terminal extends at a first side of the first source region, and
   the second control terminal extends at a second side, opposite to the first side, of the first source region.

5. The semiconductor device according to claim 4 wherein the first control terminal is substantially aligned, in said first direction of extension, to the first side of the first source region, and the second control terminal is substantially aligned, in said first direction of extension, to the second side of the first source region.

6. The semiconductor device according to claim 4, further comprising a second source region that has the first type of conductivity and extends in the body region between the first source region and the second control terminal.

7. The semiconductor device according to claim 1 wherein said device is a transistor, the first and second control terminals provide respectively a first insulated-gate region and a second insulated-gate region that comprise a respective conductive portion and a respective insulating portion, said insulating portions surrounding at least partially the respective conductive portion to insulate electrically said respective conductive portion from the semiconductor body.

8. The semiconductor device according to claim 1 wherein said second control terminal extends in the semiconductor body for a depth equal to, or greater than, a maximum depth reached by the body region.

9. The semiconductor device according to claim 1, further comprising an implanted region, having the first type of conductivity that extends in the semiconductor body to a third depth greater than said first depth.

10. The semiconductor device according to claim 1, further comprising:
   a first source region, having the first type of conductivity that extends in the body region and faces the front side; and
   a second source region, having the first type of conductivity that extends in the body region between the first source region and the second control terminal, wherein the first source region has a dopant value different from a dopant value of the second source region.

11. A method for manufacturing a semiconductor device, comprising:
- forming, in a semiconductor body, a drift region having a first type of conductivity and a first doping value, the semiconductor body having a front side and a back side opposite to one another along a first direction of extension, the drift region facing the front side;
- forming, in the drift region, a body region having a second type of conductivity opposite to the first type of conductivity, facing the front side of the semiconductor body;
- forming a first control terminal on the front side of the semiconductor body, at least partially overlapping, in the first direction of extension, the body region;
- forming a second control terminal at a first depth in the semiconductor body, within the body region, and staggered with respect to the first control terminal along the first direction of extension; and
- forming a first channel region that extends in the body region facing the first control terminal, and a second channel region that extends to a second depth in the body region, facing the second control terminal, said second depth being equal to, or greater than, said first depth, wherein:
  - the first control terminal is configured to be biased to form, in the first channel region, a first conductive channel having a main direction of conduction in a second direction of extension transverse to the first direction of extension, and
  - the second control terminal is configured to be biased to form, in the second channel region, a second conductive channel having a main direction of conduction in the first direction of extension.

12. The method according to claim 11, further comprising forming a first source region, having the first type of conductivity, in the body region and facing the front side, wherein:
- forming the first control terminal comprises forming the first control terminal at a first side of the first source region; and
- forming the second control terminal comprises forming the second control terminal in an area corresponding to a second side, opposite to the first side, of the first source region.

13. The method according to claim 12 wherein forming the first control terminal further comprises forming the first control terminal substantially aligned, in said first direction of extension, to the first side of the first source region, and forming the second control terminal comprises forming the second control terminal substantially aligned, in said first direction of extension, to the second side of the first source region.

14. The method according to claim 12, further comprising forming a second source region, having the first type of conductivity, in the body region between the first source region and the second control terminal, wherein the first source region has a dopant value different from a dopant value of the second source region.

15. The method according to claim 11 wherein forming the second control terminal comprises:
- etching a trench in the semiconductor body;
- forming, in an area corresponding to a wall of said trench, an insulating portion;
- forming, in said trench and inside the insulating portion, a conductive portion electrically insulated from the semiconductor body.

16. The method according to claim 11 wherein forming said second control terminal comprises forming the second control terminal in the semiconductor body for a depth equal to, or greater than, the maximum depth reached by the body region.

17. A method, comprising:
- driving a semiconductor device that includes a semiconductor body, having a front side and a back side opposite to one another along a first direction of extension, a drift region that extends in the semiconductor body facing the front side, and has a first type of conductivity and a first doping value, a body region, having a second type of conductivity opposite to the first type of conductivity that extends in the drift region and faces the front side of the semiconductor body, a first control terminal that extends on the front side of the semiconductor body, at least partially overlapping, along the first direction of extension, the body region, and a second control terminal which extends to a first depth in the semiconductor body, within the body region, and is staggered with respect to the first control terminal along the first direction of extension, said device having a first threshold value associated with formation of a first conductive channel in a first channel region by the first control terminal, and a second threshold value associated with formation of a second conductive channel in a second channel region by the second control terminal, the first channel region extending in the body region facing the first control terminal and second channel region extending to a second depth in the body region, facing the second control terminal, said second depth being equal to, or greater than, said first depth, the driving including:
  - biasing, in a first operating condition, the first and second control terminals to a voltage having value comprised between the first threshold value and the second threshold value to form the first conductive channel, the first conductive channel having a main direction of conduction in a second direction of extension transverse to the first direction of extension; and
  - biasing, in a second operating condition, the first and second control terminals to a voltage having a value equal to, or higher than, the second threshold value to maintain the first conductive channel and form the second conductive channel, the second conductive channel having a main direction of conduction in the first direction of extension.

18. The method according to claim 17, wherein in said first operating condition the semiconductor device is driven in a linear zone, and in said second operating condition the semiconductor device is driven in a switching zone.

* * * * *